(12) United States Patent
Lin (10) Patent No.: US 7,700,435 B2
(45) Date of Patent: *Apr. 20, 2010

(54) METHOD FOR FABRICATING DEEP TRENCH DRAM ARRAY

(75) Inventor: Shian-Jyh Lin, Taipei County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 213 days.

This patent is subject to a terminal disclaimer.

(21) Appl. No.: 12/046,470

(22) Filed: Mar. 12, 2008

(65) Prior Publication Data

US 2009/0104747 A1    Apr. 23, 2009

(30) Foreign Application Priority Data

Oct. 19, 2007   (TW) ............................... 96139266 A (51) Int. Cl.
*H01L 21/8242* (2006.01)
(52) U.S. Cl. ............... 438/243; 438/386; 438/E21.646; 438/E21.314
(58) Field of Classification Search ......... 438/242–243, 438/279–284, 427, 257–259; 257/296, 300, 257/368, 390
See application file for complete search history.

(56) References Cited

U.S. PATENT DOCUMENTS

| 5,013,680 A * | 5/1991 | Lowrey et al. ............... 438/242 |
| 6,818,515 B1 * | 11/2004 | Lee et al. ..................... 438/284 |
| 2005/0079427 A1 * | 4/2005 | Lee et al. ....................... 430/5 |

* cited by examiner

*Primary Examiner*—Dung A. Le
(74) *Attorney, Agent, or Firm*—Winston Hsu (57) ABSTRACT

A method for fabricating deep trench DRAM array is disclosed. A substrate having thereon a memory array area is provided. An array of deep trench patterns is formed in the memory array area. The deep trench (DT) capacitor patterns include first dummy DT patterns in a first column, second dummy DT patterns in a first row and a plurality of effective DT capacitor patterns. Each of the first dummy DT patterns has an extended width (W) along a first direction, which is greater than or equal to a photomask's shift tolerance. Each of the second dummy DT patterns has an extended length (L) along a second direction, which is greater than or equal to the photomask's shift tolerance. The first direction is normal to the second direction.

13 Claims, 10 Drawing Sheets

METHOD FOR FABRICATING DEEP TRENCH DRAM ARRAY

BACKGROUND OF THE INVENTION

1. Field of the Invention

The present invention relates generally to a method for fabricating a semiconductor device such as Dynamic Random Access Memory (DRAM). More specifically, the present invention relates to an integration method for fabricating a deep trench DRAM array and recess gate trenches thereof. The present invention provides special rules applying to the periphery of the memory array in different phases of its manufacture in order to prevent defects from occurring.

2. Description of the Prior Art

Integrated circuit devices are continually being made smaller in order to increase speed, make the device more portable and to reduce the cost of manufacturing the device. However, certain designs have a minimum feature size, which cannot be reduced without compromising the integrity of electrical isolation between devices and consistent operation of the device.

For example, dynamic random access memory devices (DRAMs), which use vertical metal oxide semiconductor field effect transistors (MOSFETs) with deep trench storage capacitors, have a minimum features size of approximately 90 nm~0.15 ∥m. Below that size, the internal electric fields exceed the upper limit for storage node leakage, which decreases retention time below an acceptable level. Therefore, there is a need for different methods and/or different structures to further reduce the size of integrated circuit devices.

With the continued reduction in device size, sub-micron scale MOS transistors have to overcome many technical challenges. As the MOS transistors become narrower, that is, their channel length decreases, problems such as junction leakage, source/drain breakdown voltage, and data retention time become more pronounced.

One solution to decrease the physical dimension of ULSI circuits is to form recess gate or "trench-type" transistors, which have a gate electrode buried in a groove formed in a semiconductor substrate. This type of transistor reduces short channel effects by effectively lengthening the effective channel length by having the gate extend into the semiconductor substrate.

The recess-gate MOS transistor has a gate insulation layer formed on sidewalls and bottom surface of a recess gate trench etched into a substrate, a conductive filling the recess, contrary to a planar gate type transistor having a gate electrode formed on a planar surface of a substrate. However, the aforesaid recess-gate technology still has many shortcomings that need to be improved.

SUMMARY OF THE INVENTION

It is one object of this invention to provide an improved method for fabricating a memory array of trench DRAM. From the aspect of process integration, special process rules are applied to the periphery of the memory array in different phases of manufacture in order to avoid defects from occurring.

According to the claimed invention, a method for fabricating deep trench DRAM array is disclosed. A substrate having thereon a memory array area is provided. An array of deep trench patterns is formed in the memory array area. The deep trench (DT) capacitor patterns include first dummy DT patterns in a first column, second dummy DT patterns in a first row and a plurality of effective DT capacitor patterns. Each of the first dummy DT patterns has an extended width (W) along a first direction, which is greater than or equal to a photomask's shift tolerance. Each of the second dummy DT patterns has an extended length (L) along a second direction, which is greater than or equal to the photomask's shift tolerance. The first direction is normal to the second direction.

These and other objectives of the present invention will no doubt become obvious to those of ordinary skill in the art after reading the following detailed description of the preferred embodiment that is illustrated in the various figures and drawings.

DETAILED DESCRIPTION

FIGS. 1-7 are schematic, cross-sectional diagrams illustrating a self-aligned method for fabricating a recess gate trench in accordance with the preferred embodiment of this invention.

Figure 1:
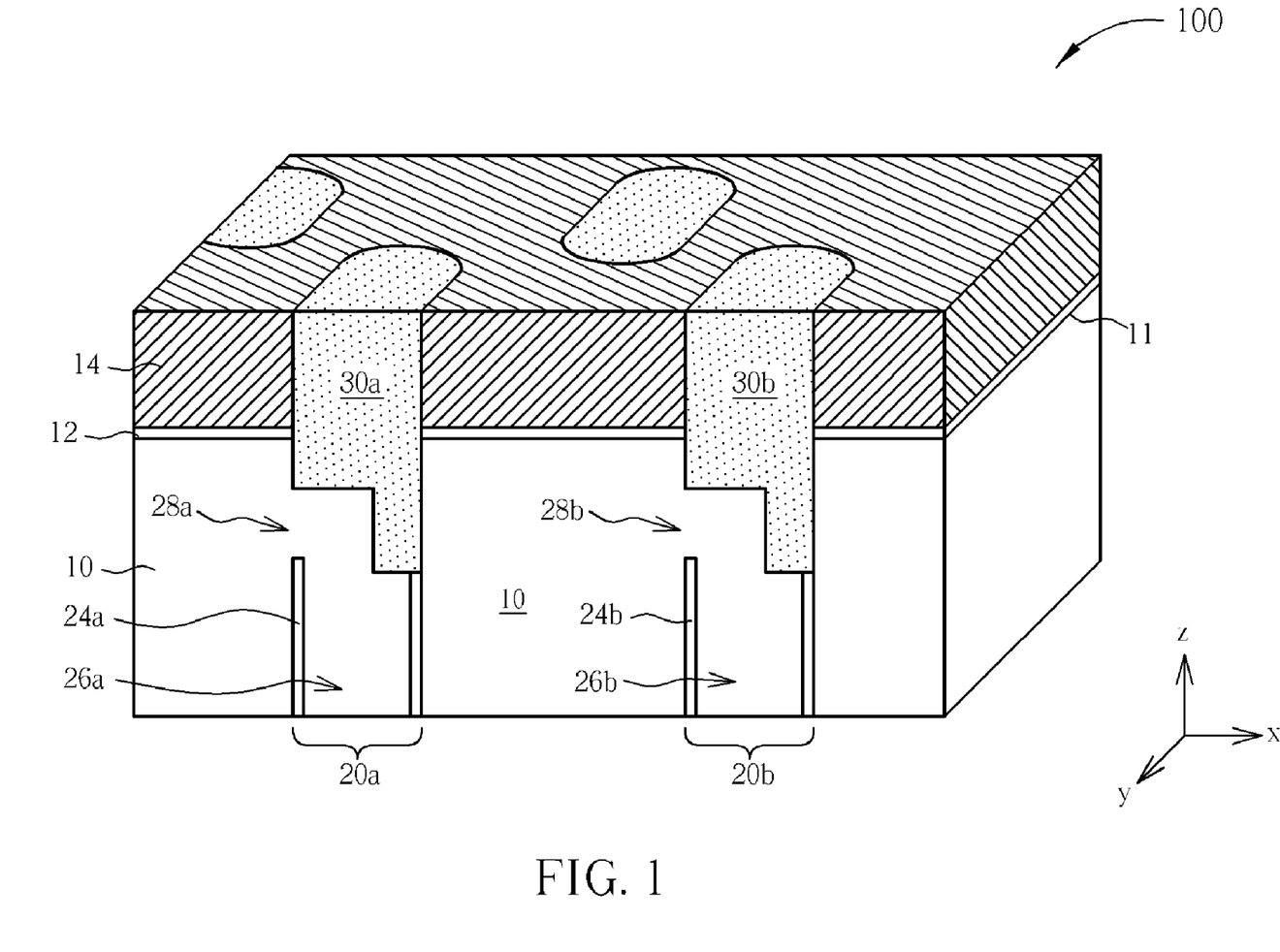
FIGS. 1-7 are schematic, cross-sectional diagrams illustrating a self-aligned method for fabricating a recess gate trench in accordance with the preferred embodiment of this invention.

As shown in FIG. 1, a semiconductor substrate 10 is provided. A pad oxide layer 12 is deposited on the semiconductor substrate 10. A pad nitride layer 14 is deposited on the pad oxide layer 12. A plurality of deep trench capacitors 20a and 20b are formed within a memory array region 100 of the semiconductor substrate 10. The deep trench capacitors 20a and 20b are fabricated using methods known in the art. Therefore, the details of the fabrication method of forming the deep trench capacitors 20a and 20b are omitted.

The deep trench capacitor 20a includes a sidewall capacitor dielectric layer 24a and a doped polysilicon layer 26a, and the deep trench capacitor 20b includes a sidewall capacitor dielectric layer 24b and a doped polysilicon layer 26b. It is known that the doped polysilicon layers 26a and 26b functions as a top electrode of the deep trench capacitors 20a and 20b, respectively.

For the sake of simplicity, merely the upper portions of the deep trench capacitors 20a and 20b are schematically shown in the accompanying figures, while the lower portions of the deep trench capacitors 20a and 20b including the buried plate (capacitor bottom plate) are not shown.

A so-called Single-Sided Buried Strap (SSBS) process is carried out to form single-sided buried strap 28a and 28b in the upper portions of the deep trench capacitors 20a and 20b respectively. Subsequently, a Trench Top isolation Layer such as a Trench Top Oxide (TTO) layers 30a and 30b are formed to cap the single-sided buried strap 28a and 28b respectively. The TTO layers 30a and 30b, which may be made of silicon oxide deposited by high-density plasma chemical vapor deposition methods, extrude from a main surface 11 of the semiconductor substrate 10.

The aforesaid SSBS process generally comprises the steps of etching back the sidewall capacitor dielectric layers 24a and 24b and the doped polysilicon (or so-called Poly-2) 26a and 26b to a first depth; refilling the recess with another layer of polysilicon (or so-called Poly-3); etching back the Poly-3 to a second depth; forming an asymmetric spacer on interior sidewall of the recess; etching away the Poly-3 and Poly-2 that are not covered by the asymmetric spacer; filling the recess with TTO insulation layer; and chemical mechanical polishing the TTO insulation layer to form the TTO layers 30a and 30b that are substantially coplanar with the pad nitride layer 14.

Figure 2:
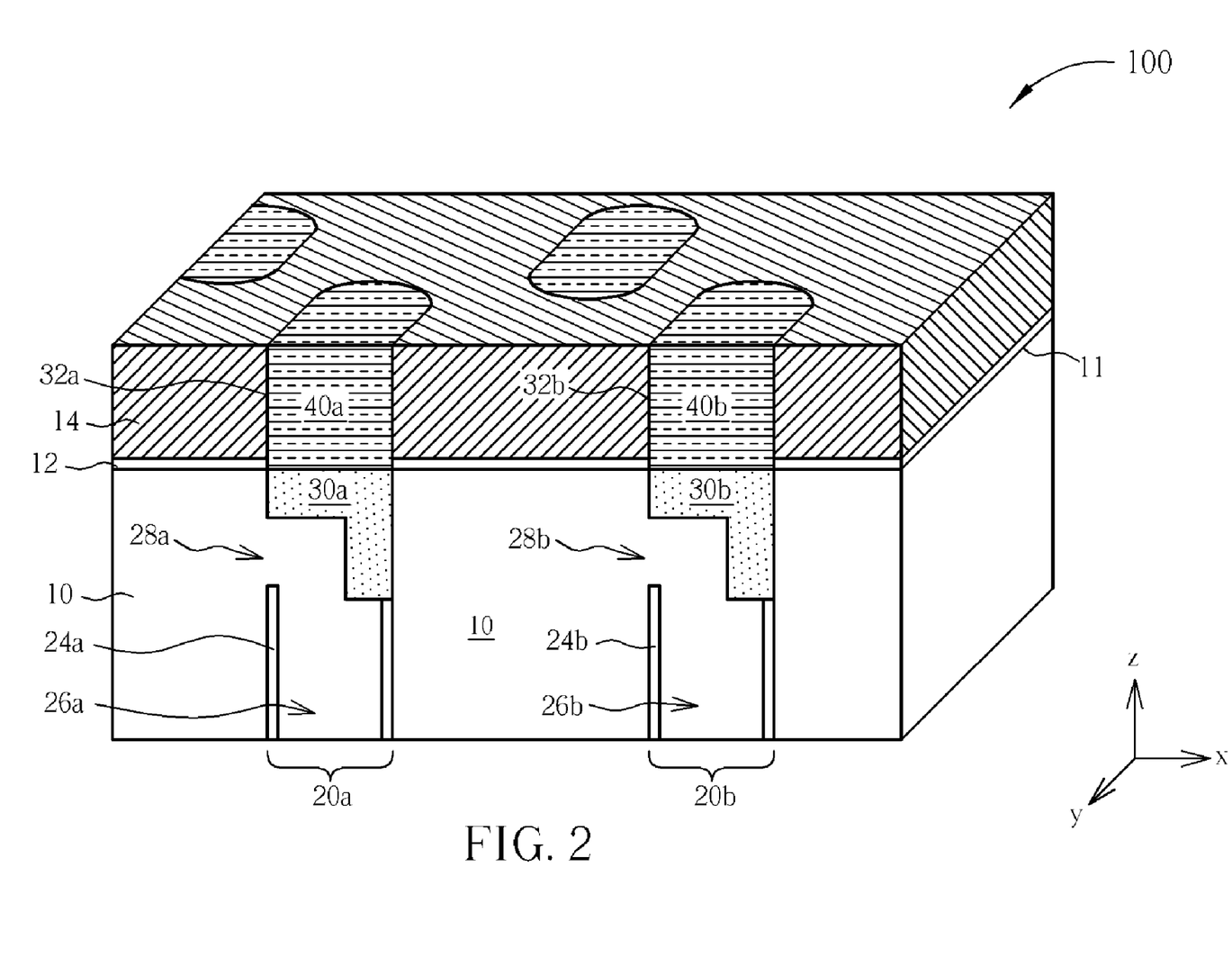

Subsequently, as shown in FIG. 2, an upper portion of the TTO layers 30a and 30b are selectively etched away. The pad nitride layer 14 is substantially intact. According to the preferred embodiment of this invention, the upper portions of the TTO layers 30a and 30b that are above the main surface 11 of the semiconductor substrate 10 are removed, thereby forming cavity 32a and cavity 32b directly above the deep trench capacitors 20a and 20b respectively.

Thereafter, a chemical vapor deposition (CVD) process is performed to deposit a polysilicon layer (sacrificing material layer; not shown) on the semiconductor substrate 10, which fills the cavities 32a and 32b. The excess polysilicon layer outside the cavities 32a and 32b and the polysilicon layer above the pad nitride layer 14 are removed by conventional chemical mechanical polishing (CMP) methods, thereby forming polysilicon plugs 40a and 40b within the cavities 32a and 32b respectively.

Figure 3:
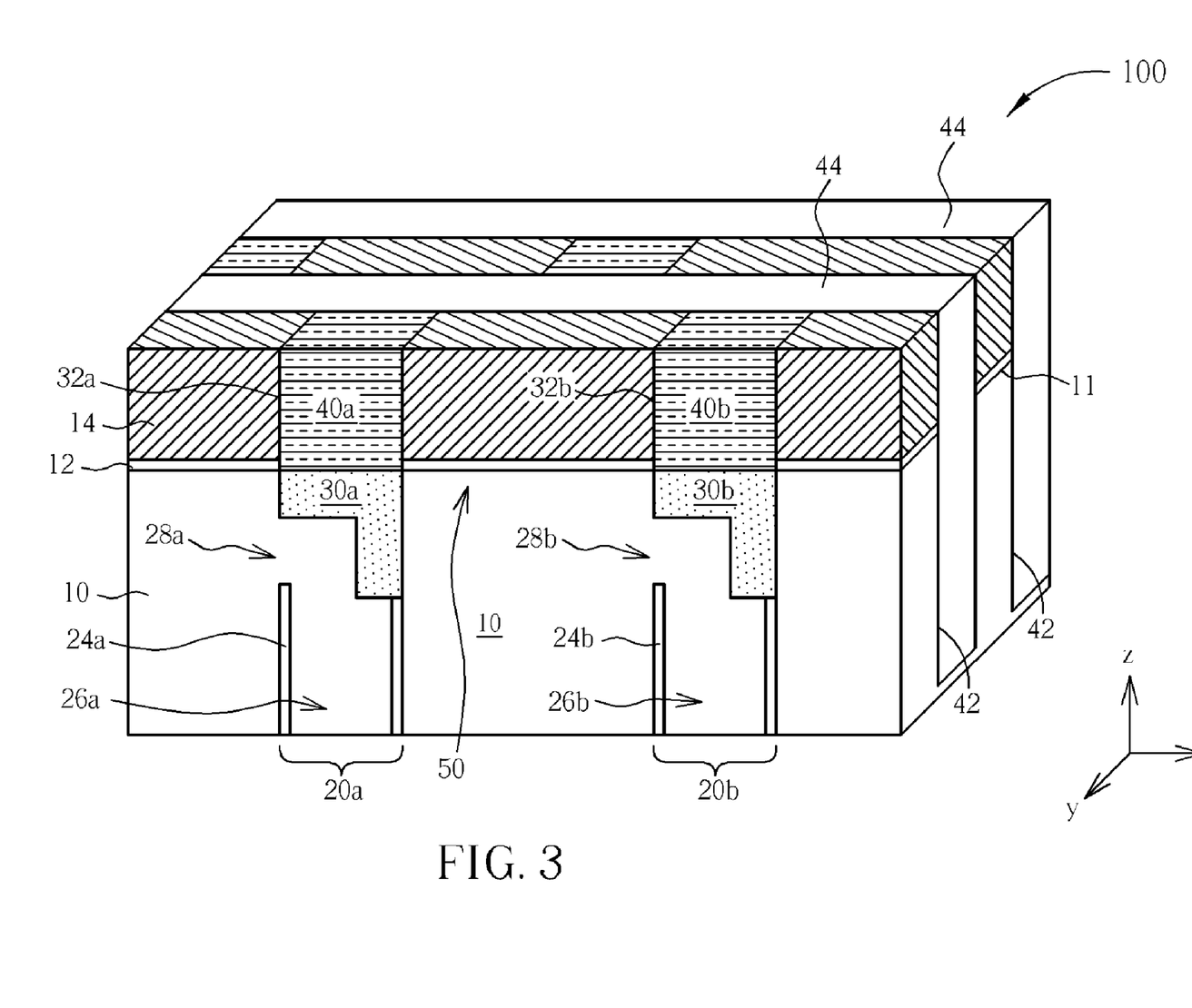

As shown in FIG. 3, a lithographic process and a subsequent dry etching process are carried out to define active areas and shallow trench isolation (STI) regions on the semiconductor substrate 10. To form the STI regions, the pad nitride layer 14, the pad oxide layer 12 and the semiconductor substrate 10 within the pre-determined strip areas are etched away, thereby forming line-shaped isolation trenches 42 elongating along the reference x-axis and the line-shaped active areas 50 between the deep trench capacitors 20a and 20b.

It is understood that when etching the isolation trenches 42, portions of the deep trench capacitors 20a and 20b and portions of the polysilicon plugs 40a and 40b above the deep trench capacitors 20a and 20b are pared away. Thereafter, an insulating layer (not shown) such as HDPCVD oxide is deposited on the semiconductor substrate 10 and fills the isolation trenches 42.

The excess insulating layer outside the isolation trenches 42 and the insulating layer above the pad nitride layer 14 are removed by conventional CMP methods, thereby forming STI regions 44. At this point, the top surfaces of the STI regions 44 are coplanar with the top surfaces of the polysilicon plugs 40a and 40b and with top surfaces of the pad nitride layer 14.

Figure 4:
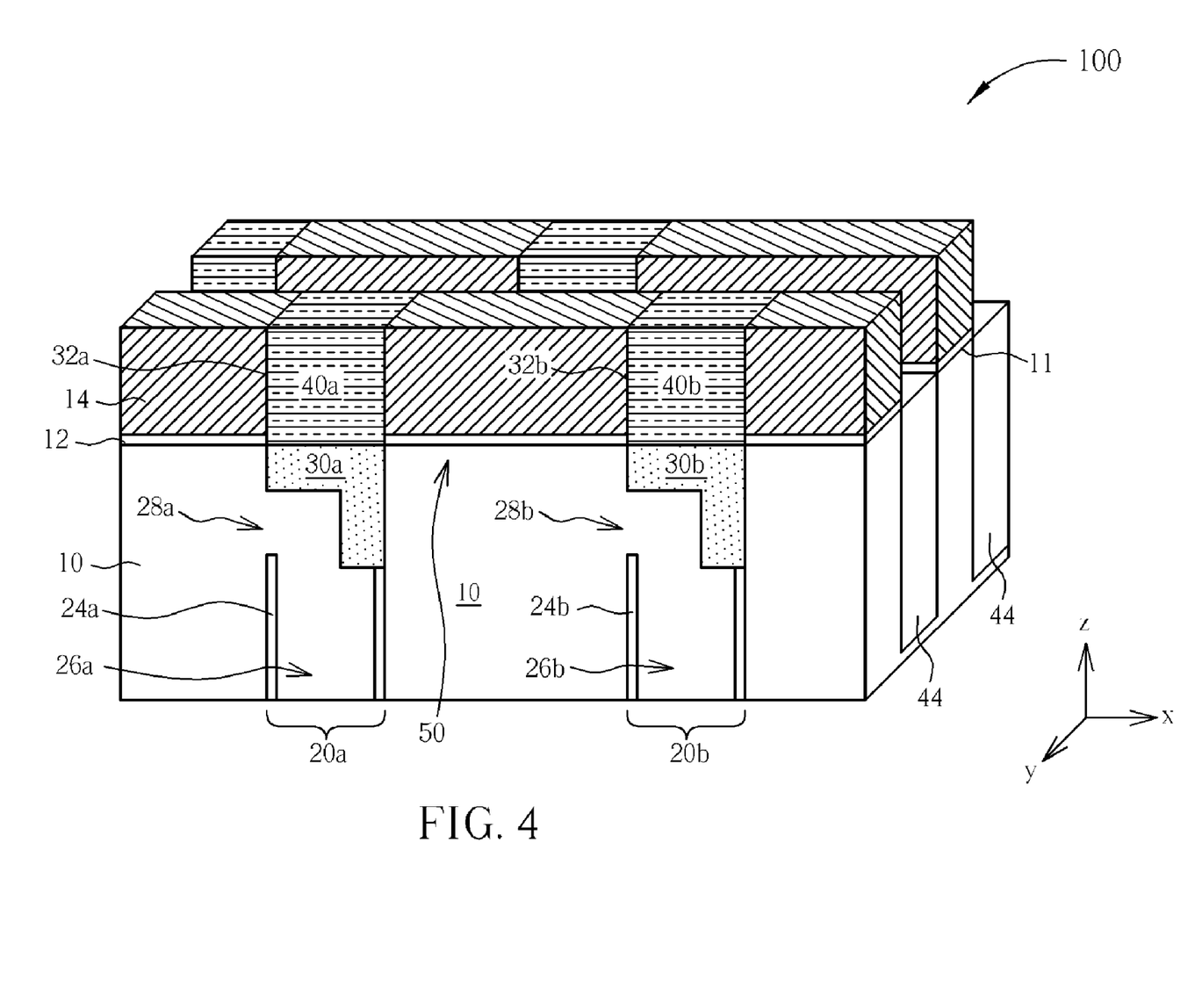

As shown in FIG. 4, using the polysilicon plugs 40a and 40b as well as the pad nitride layer 14 as an etching mask, an etching process is performed to selectively etch away an upper portion of the STI regions 44. According to the preferred embodiment of this invention, the thickness of the STI regions 44 that is above the main surface 11 of the semiconductor substrate 10 is removed.

Figure 5:
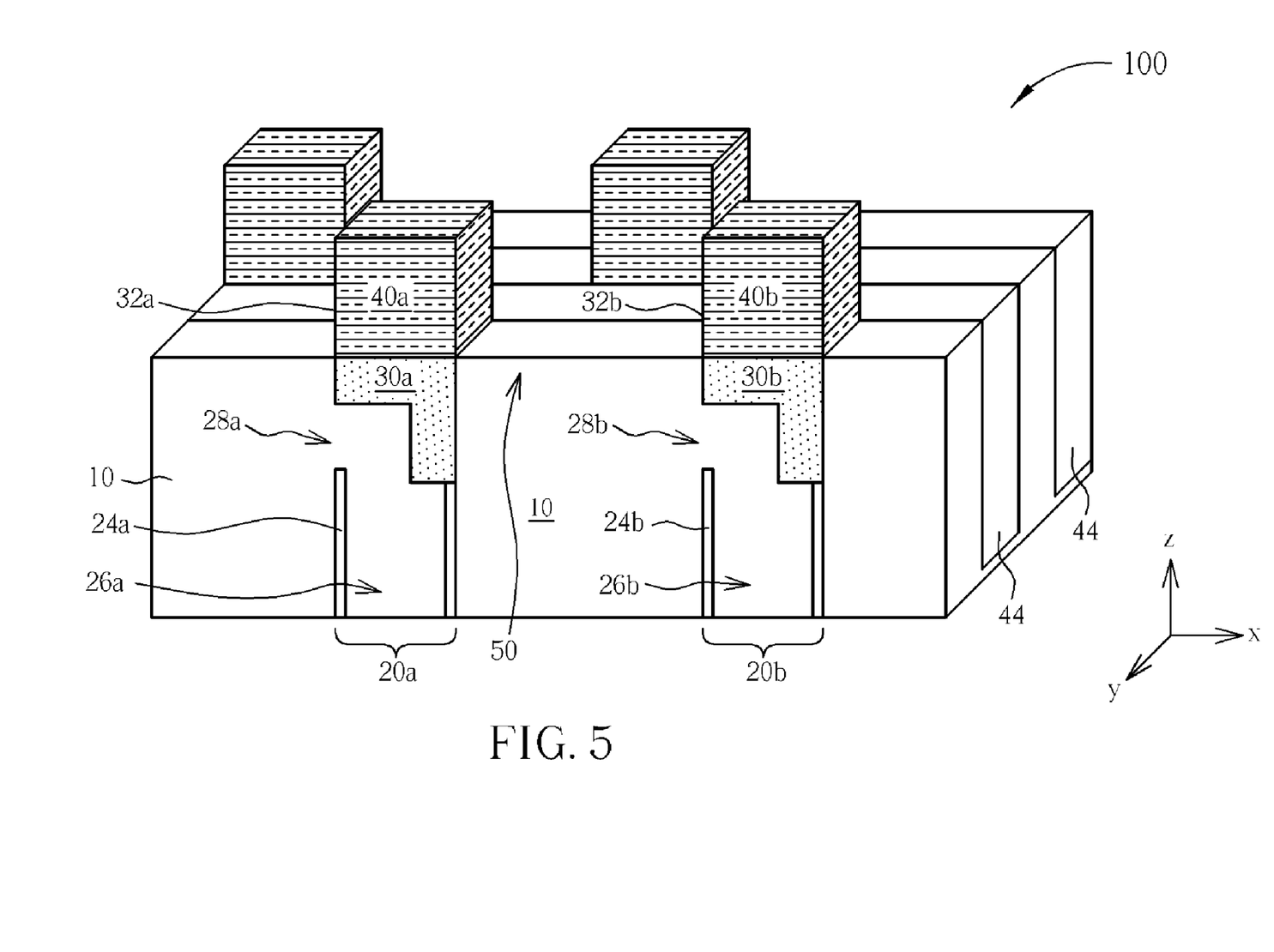

As shown in FIG. 5, another etching process is carried out to selectively etch away the pad nitride layer 14 and the pad oxide layer 12. At this point, merely the polysilicon plugs 40a and 40b directly above deep trench capacitors 20a and 20b protrude from the main surface 11 of the semiconductor substrate 10. The aforesaid etching process for etching the pad nitride layer 14 and the pad oxide layer 12 may include various wet etching methods including but not limited to hot phosphorous wet etching.

Figure 6:
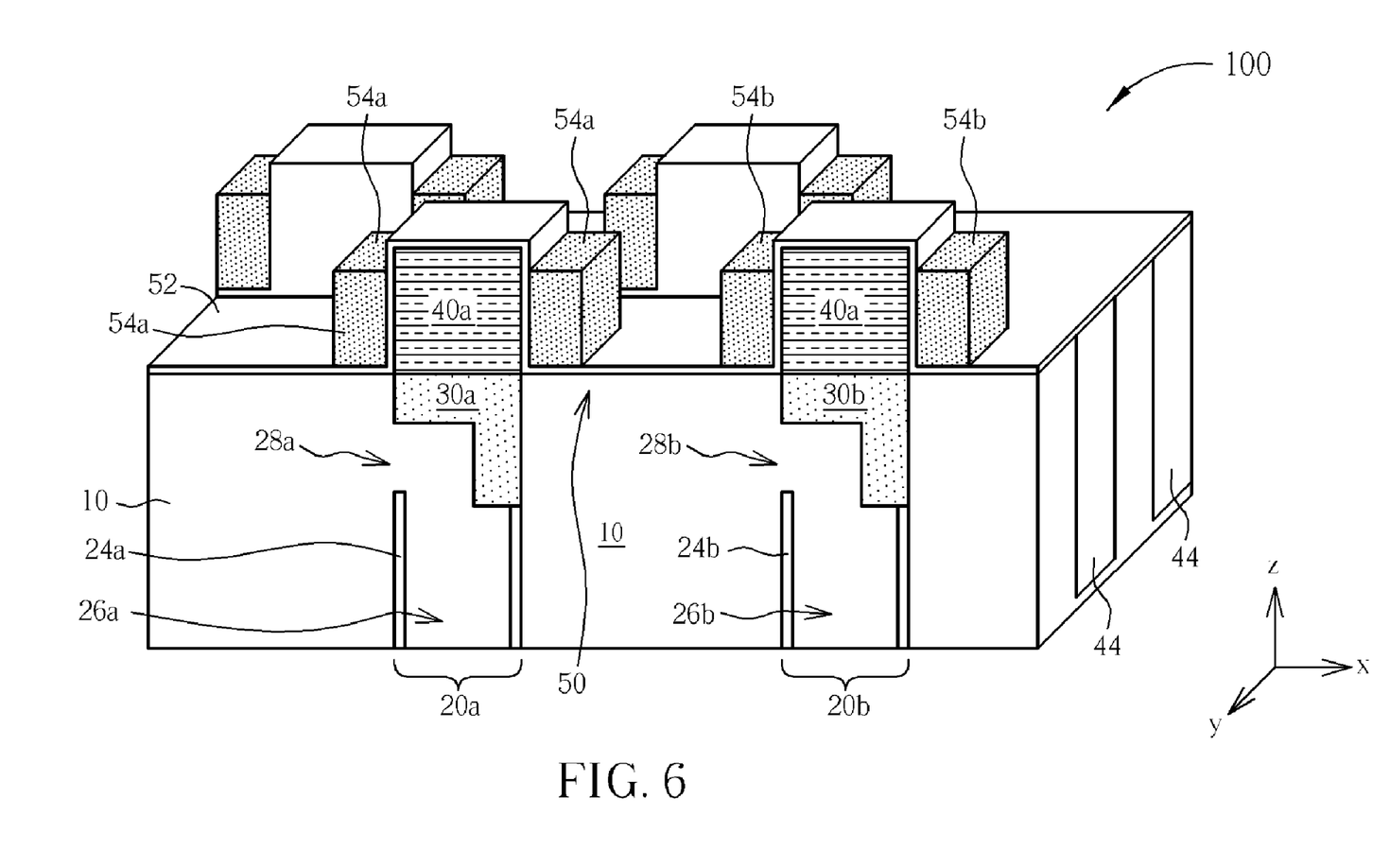

As shown in FIG. 6, a conformal silicon nitride lining layer 52 is deposited on the semiconductor substrate 10. The silicon nitride lining layer 52 conformally covers the top surface and sidewalls of the polysilicon plugs 40a and 40b. The silicon nitride lining layer 52 also covers the top surfaces of the STI regions 44 and the active areas 50.

Thereafter, a pair of sidewall spacers 54a and a pair of sidewall spacers 54b are formed on opposite sidewalls of the polysilicon plugs 40a and 40b, respectively. As specifically indicated in FIG. 6, the pairs of sidewall spacers 54a and 54b are disposed along the reference x-axis. To form the sidewall spacers 54a and 54b, a silicon layer (not shown) such as amorphous silicon or polysilicon is deposited. The silicon layer is then anisotropically etched to form annular sidewall spacers around the polysilicon plugs 40a and 40b. An x-direction tilt-angle ion implantation process is then performed to implant dopants such as BF2 into the annular sidewall spacers along the reference x-axis. Thereafter, a selective etching process is carried out to remove the non-doped portions of the annular sidewall spacers along the reference y-axis.

Optionally, an oxidation process may be performed to oxidize the sidewall spacers 54a and 54b formed on respective sidewalls of the polysilicon plugs 40a and 40b. The sidewall spacers 54a and 54b cover a portion of the active areas 50. In a self-aligned fashion, the sidewall spacers 54a and 54b define the position and pattern of the recess gate trenches to be formed in the subsequent process steps, which are the active areas that are not covered by the sidewall spacers 54a and 54b.

Figure 7:
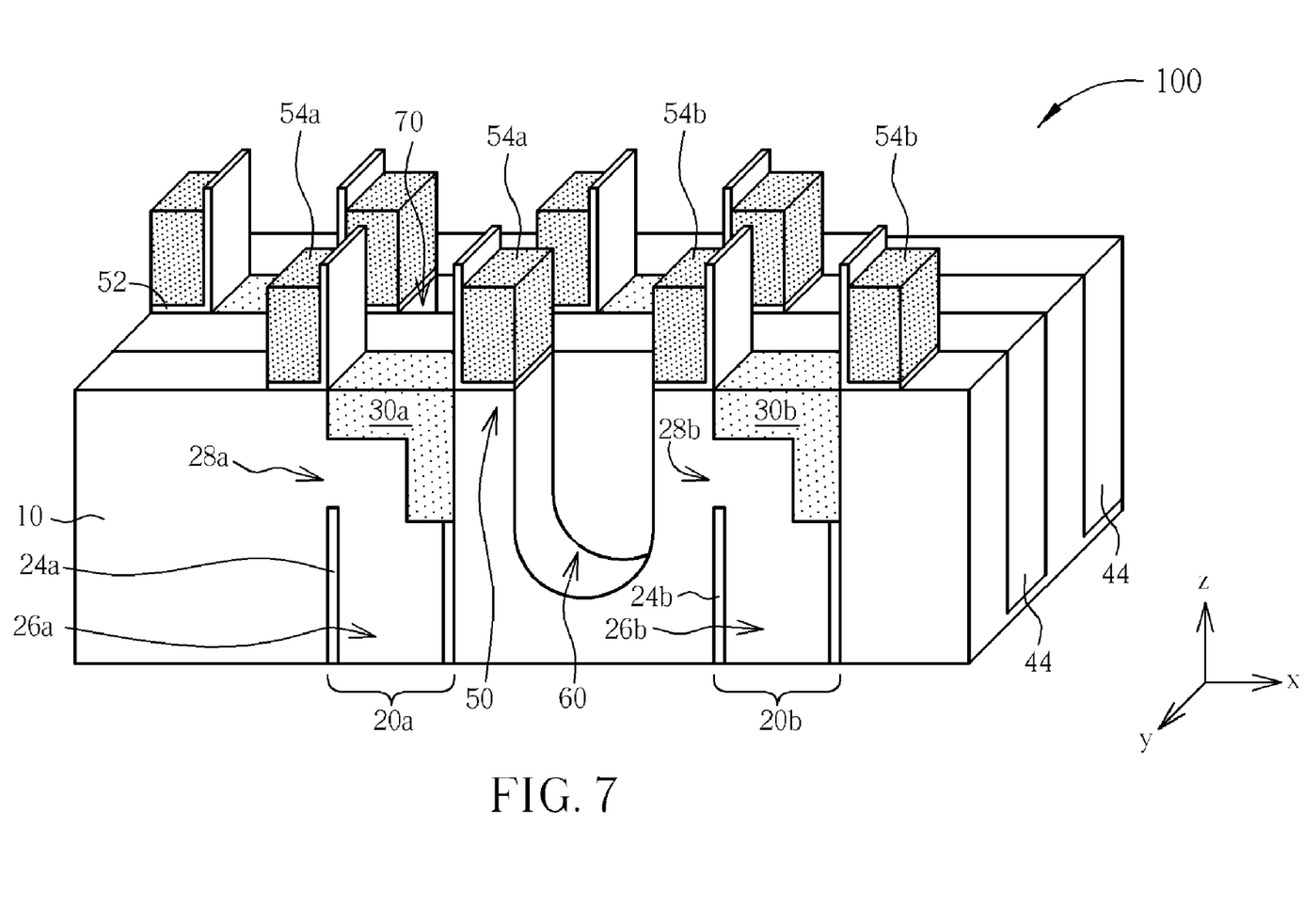

As shown in FIG. 7, using the sidewall spacers 54a and 54b as an etching mask, a self-aligned dry etching process is performed to etch the silicon nitride lining layer 52 and the active areas 50 that are not covered by the sidewall spacers 54a and 54b, thereby forming recess gate trenches 60 into the semiconductor substrate 10. Preferably, the gate trenches 60 have a depth of 90~3000 angstroms, more preferably 2000 angstroms, below the main surface 11 of the semiconductor substrate 10.

When etching the active areas 50 in order to form the recess gate trenches 60, the polysilicon plugs 40a and 40b are also removed, thereby forming recessed regions 70 directly above the deep trench capacitors 20a and 20b. Thereafter, the remaining silicon nitride lining layer 52 and the sidewall spacers 54a and 54b are removed.

To prevent defects such as word line shorting from occurring, some special rules that are applied to different phases of manufacture are incorporated into the above-described self-aligned method for fabricating the recess gate trench and DRAM according to this invention. For the sake of process integration, these rules are specifically applied to periphery of the memory array, which takes peripheral process into account and are capable of increasing reliability of the circuit fabricated at the periphery of the memory array as well as process window.

The details of the aforesaid rules incorporated into the present invention self-aligned method for fabricating the trench DRAM are now described with reference to FIGS. 8-10. It is noteworthy that these special rules can also be applied to define corresponding patterns on the photomasks.

Figure 8:
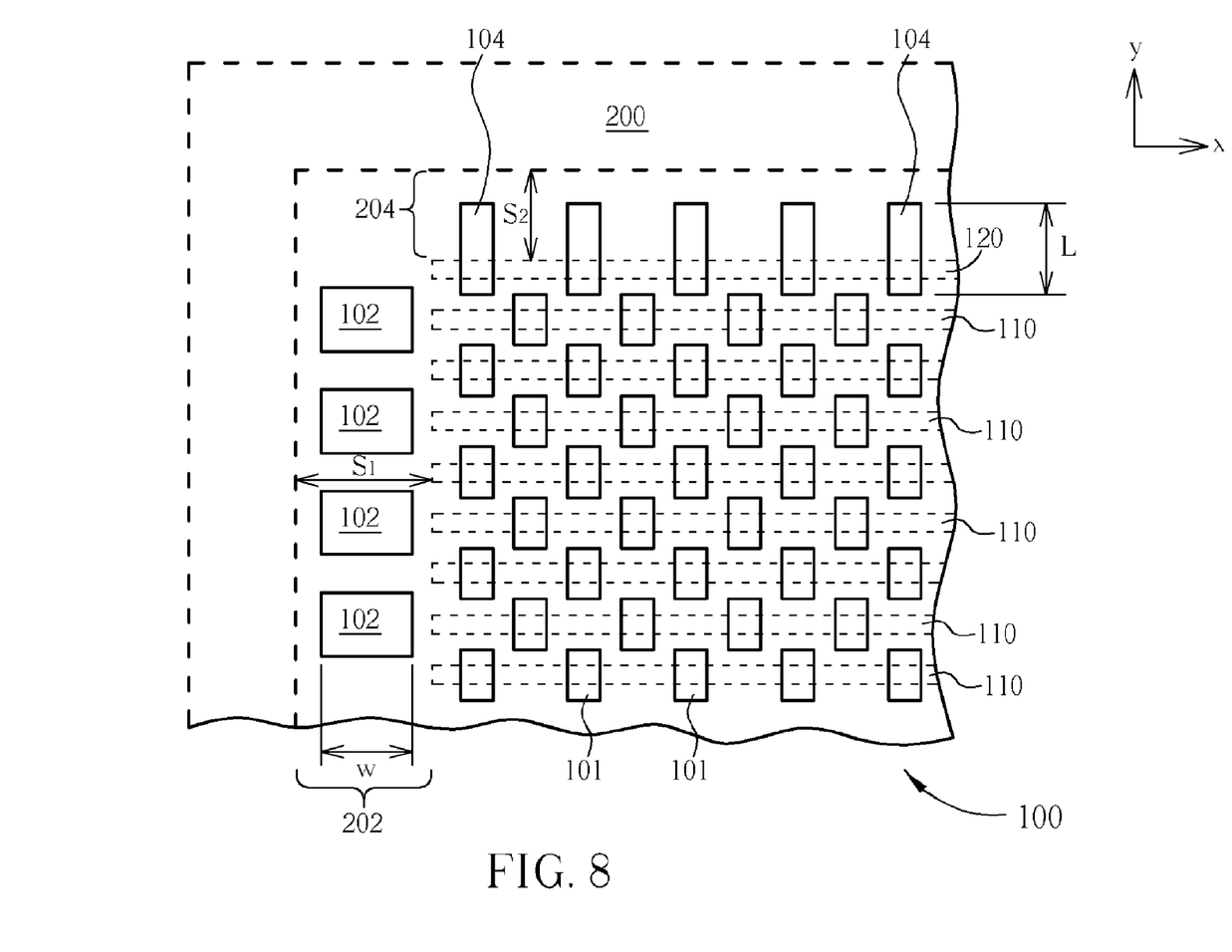
FIG. 8 is a top view illustrating a portion of the layout of a trench DRAM array in accordance with the preferred embodiment of this invention.

FIG. 8 is a top view illustrating a portion of the layout of a trench DRAM array in accordance with the preferred embodiment of this invention. As shown in FIG. 8, the memory array 100 includes a plurality of trench capacitor patterns 101, 102 and 104. The trench capacitor patterns 101 are effective and are arranged in a chessboard-like configuration. The trench capacitor patterns 102 and 104 are dummy deep trench (DT) patterns. The trench capacitor patterns 102 are disposed in the first column of the memory array 100. The trench capacitor patterns 104 are disposed in the first row of the memory array 100.

During the fabrication process, these dummy DT patterns, i.e., trench capacitor patterns 102 and 104, are utilized to create a substantially identical pattern density environment in a particular lithographic process step for formation of the effective trench capacitor patterns 101 of the memory array 100 such that each one of the effective trench capacitor patterns 101 can be defined on a semiconductor substrate under substantially the same exposure conditions. The dummy trench capacitor patterns 102 and 104 have the same capacitor structures as that of the effective trench capacitor patterns 101, while dummy trench capacitor patterns 102 and 104 are not connected to any voltage signals during practical operation.

According the preferred embodiment of this invention, each of the trench capacitor patterns 102 in the first column has a wider width W (along the reference x-axis) compared to the width of each of the effective trench capacitor patterns 101 of the memory array 100, and the length along the reference y-axis of each of the trench capacitor patterns 102 in the first column is the same as that of each of the effective trench capacitor patterns 101. The width W of each of the trench capacitor patterns 102 is greater than or equal to a photomask's shift tolerance. Preferably, the width W of each of the trench capacitor patterns 102 is greater than 200 nm.

According the preferred embodiment of this invention, each of the trench capacitor patterns 104 in the first row has a extended length L (along the reference y-axis) compared to the length of each of the effective trench capacitor patterns 101 of the memory array 100, and the width along the reference x-axis of each of the trench capacitor patterns 104 in the first row is the same as that of each of the effective trench capacitor patterns 101. The length L of each of the trench capacitor patterns 104 is greater than or equal to a photomask's shift tolerance. Preferably, the length L of each of the trench capacitor patterns 104 is greater than 200 nm.

In FIG. 8, active areas or AA patterns 110 and 120 of the memory array 100 and dummy active area (dummy AA) pattern 200 along the periphery of the memory array 100 are indicated with dashed lines. The AA pattern 120 overlaps with the trench capacitor patterns 104 in the first row. It is understood that although both shown in the same figure the AA patterns 110 and 102, and the dummy AA pattern 200 are defined on the semiconductor substrate with one so-called AA photomask and corresponding lithographic and etching processes.

According the preferred embodiment of this invention, the dummy AA pattern 200 is continuously disposed along the periphery of the memory array 100 and encompasses the memory array 100. Alternatively, the dummy AA pattern 200 may be discontinuously disposed along the periphery of the memory array 100. It is important that buffer shallow trench isolation (STI) regions 202 and 204 are formed between the dummy AA pattern 200 and the memory array 100, wherein the buffer STI region 202 covers the entire first column of the trench capacitor patterns 102, while the buffer STI region 204 merely covers a portion of each of the trench capacitor patterns 104 along the row. Preferably, the width $S_1$ of the buffer STI region 202 and the width $S_2$ of the buffer STI region 204 are both greater than 200 nm.

When using a non-critical photomask and corresponding photoresist pattern to mask the entire area of the memory array 100, the buffer STI regions 202 and 204 prevent undesired effects such as local shifting or misalignment at the periphery of the memory array brought from the non-critical photomask. Accordingly, the buffer STI regions 202 and 204 can increase the process window. The aforesaid non-critical photomask and photoresist pattern defined by such non-critical photomask are typically used to cover and protect only the memory array 100 in order to facilitate the fabrication processes that are merely performed in the peripheral circuit areas, for example, when forming gate oxide having different thicknesses in the peripheral circuit areas.

Figure 9:
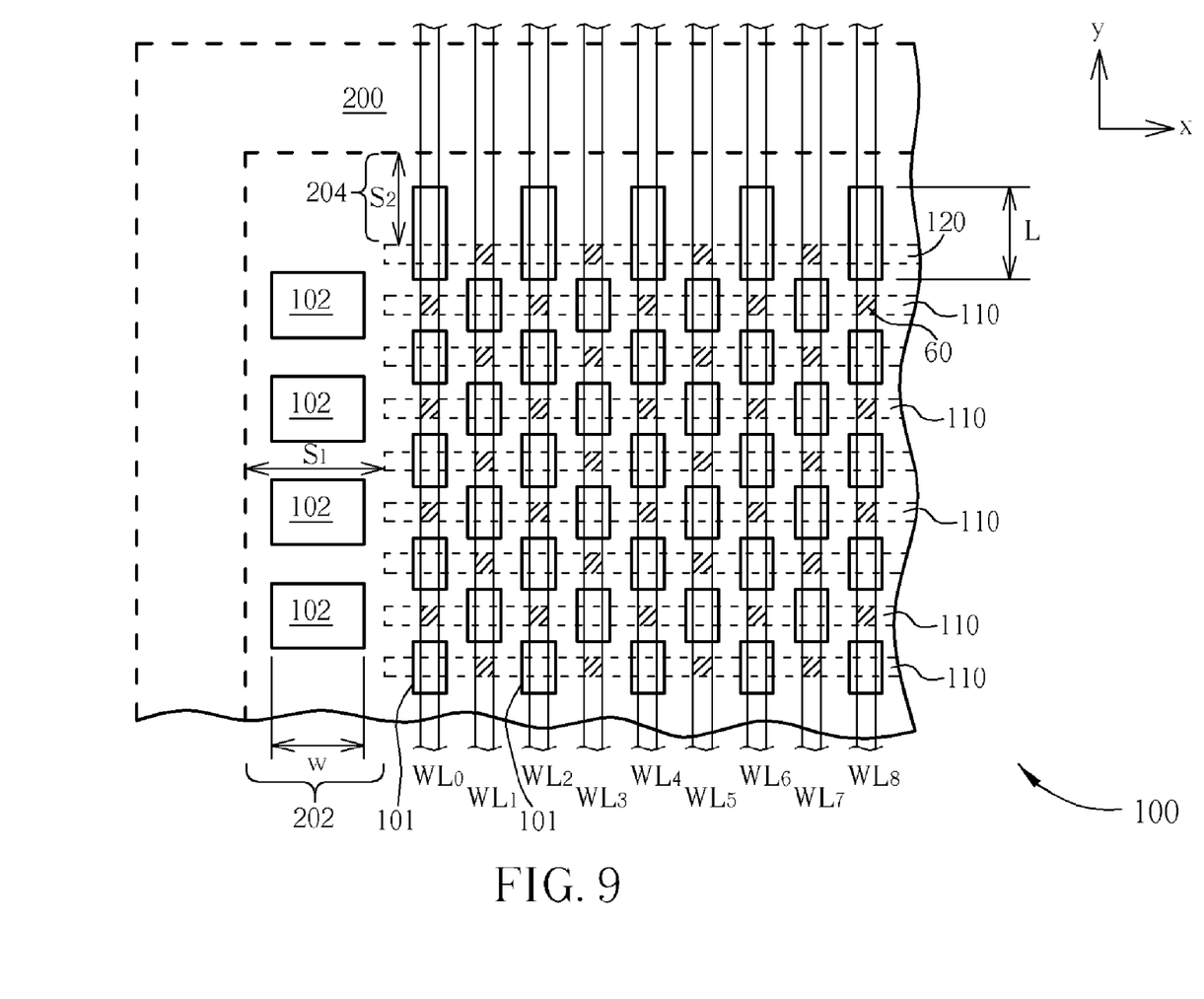
FIG. 9 shows the layout of a trench DRAM array after the word line patterns ($WL_0$-$WL_8$) are disposed along the reference y-axis in accordance with the preferred embodiment of this invention.

FIG. 9 shows the layout of a trench DRAM array after the word line patterns ($WL_0$-$WL_8$) are disposed along the reference y-axis in accordance with the preferred embodiment of this invention. According to this invention, another process rule is made for the layout of the word line patterns.

As shown in FIG. 9, after the formation of the recess gate trenches 60 (as indicated by the hatched areas) within the memory array 100, word line patterns ($WL_0$-$WL_8$) are formed on the semiconductor substrate, wherein word line pattern $WL_0$ passes the second column of the recess gate trenches 60 and the second column of the trench capacitor patterns 101, word line pattern $WL_1$ passes the third column of the recess gate trenches 60 and the third column of the trench capacitor patterns 101, and so on. Taking the electrical performance into consideration, it is forbidden to dispose any word line patterns directly above the first column of the dummy trench capacitor patterns 102.

Figure 10:
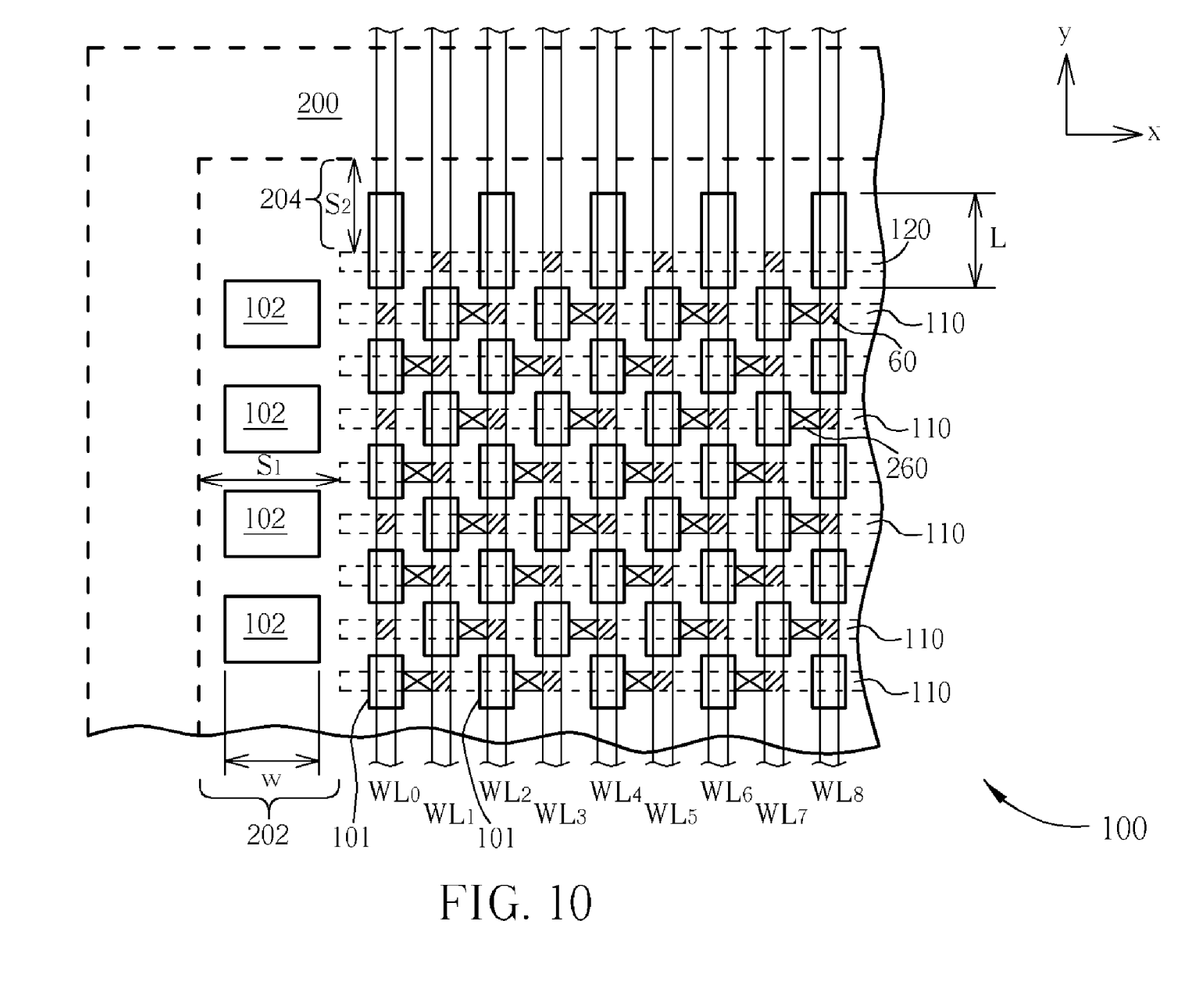
FIG. 10 shows the layout of a trench DRAM array after the formation of the bit line contact (CB) patterns in accordance with the preferred embodiment of this invention.

FIG. 10 shows the layout of a trench DRAM array after the formation of the bit line contact (CB) patterns in accordance with the preferred embodiment of this invention. According to this invention, another process rule is made for the layout of the CB patterns.

As shown in FIG. 10, according to the present invention method for fabricating the trench DRAM, after the formation of the word line patterns and the deposition of the dielectric layer(s), CB patterns 260 are formed in the dielectric layer within the memory array 100. Taking the electrical performance into consideration, it is forbidden to dispose any CB pattern at one side of the dummy trench capacitor patterns 102 in the first column and neither at one side of the dummy trench capacitor patterns 104 in the first row.

Those skilled in the art will readily observe that numerous modifications and alterations of the device and method may be made while retaining the teachings of the invention.

What is claimed is:

1. A method for fabricating a deep trench DRAM array, the method comprising the steps of:
   providing a semiconductor substrate having thereon a memory array region; and
   forming a plurality of trench capacitor patterns within the memory array region of the semiconductor substrate, the plurality of trench capacitor patterns comprising first dummy trench capacitor patterns disposed in a first column, second dummy trench capacitor patterns disposed in a first row, and a plurality of effective trench capacitor patterns, wherein each of the first dummy trench capacitor patterns in the first column has an extended width along a first direction, and each of the second dummy trench patterns has an extended length along a second direction independent from the first direction, each of the plurality of effective trench capacitor patterns has an effective width and an effective length with regard to the extended width and the extended length.

2. The method according to claim 1, wherein the extended width of each of the first dummy trench capacitor patterns is dependent from a photomask's shift tolerance and greater than the photomask's shift tolerance.

3. The method according to claim 1, wherein the extended length of the second dummy trench patterns is dependent from a photomask shift tolerance and greater than the photomask's shift tolerance.

4. The method according to claim 1, wherein each of the first dummy trench capacitor patterns in the first column has a length along the second direction and the length is equal to that of each of the effective trench capacitor patterns.

5. The method according to claim 4 wherein each of the second dummy trench capacitor patterns in the first row has a width along the first direction and the width is equal to that of each of the effective trench capacitor patterns.

6. The method according to claim 1 further comprising the following steps:
    forming a dummy active area pattern along a periphery of the memory array region to constitute a first buffer shallow trench isolation (STI) region and a second buffer STI region between the dummy active area pattern and the memory array region, wherein the first buffer STI region completely covers the first dummy trench capacitor patterns in the first column and the second buffer STI region covers a portion of the second dummy trench capacitor patterns in the first row.

7. The method according to claim 6, wherein the dummy active area pattern encompasses the memory area region.

8. The method according to claim 6, wherein the dummy active area pattern independents from the first dummy trench capacitor patterns in the first column.

9. The method according to claim 6, wherein the dummy active area pattern independents from the second dummy trench capacitor patterns in the first row.

10. The method according to claim 1, wherein the extended width is greater than 200 nm.

11. The method according to claim 1, wherein the extended length is greater than 200 nm.

12. The method according to claim 10, wherein the extended length is greater than 200 nm.

13. The method according to claim 1, wherein the first direction is orthogonal to the second direction.

* * * * *